United States Patent [19]
Sedlak

[11] Patent Number: 6,166,952
[45] Date of Patent: Dec. 26, 2000

[54] READ-ONLY MEMORY HAVING SPECIALLY OUTPUT CIRCUITS AND WORD LINE CONNECTED TO A GROUP OF MEMORY CELLS

[75] Inventor: Holger Sedlak, München, Germany

[73] Assignee: Infineon Technologies AG, Munich, Germany

[21] Appl. No.: 09/093,573

[22] Filed: Jun. 8, 1998

Related U.S. Application Data

[63] Continuation of application No. PCT/DE96/02241, Nov. 21, 1996.

[30]  Foreign Application Priority Data

Dec. 6, 1995 [DE] Germany ............................ 195 45 557

[51] Int. Cl.[7] ..................................................... G11C 16/04
[52] U.S. Cl. ................................ 365/185.05; 365/185.18; 365/185.25
[58] Field of Search ................................. 365/230.03, 63, 365/94, 185.05, 185.11, 185.23, 185.25, 185.18

[56] References Cited

U.S. PATENT DOCUMENTS

| | | | |
|---|---|---|---|
| 5,065,364 | 11/1991 | Atwood et al. | ............................ 365/185 |
| 5,249,158 | 9/1993 | Kynett et al. | ........................ 365/230.03 |
| 5,267,196 | 11/1993 | Talreja et al. | ............................ 365/185 |
| 5,337,281 | 8/1994 | Kobayashi et al. | ........................ 365/218 |
| 5,687,117 | 11/1997 | Chevallier et al. | ................. 365/185.12 |
| 5,768,194 | 6/1998 | Matsubara et al. | ................. 365/185.33 |
| 5,825,688 | 10/1998 | Ueki | ..................................... 365/185.11 |
| 5,945,717 | 8/1999 | Chevallier | ................................ 257/390 |
| 5,963,478 | 10/1999 | Sedlak | ................................. 365/185.29 |

FOREIGN PATENT DOCUMENTS

| | | |
|---|---|---|
| 0 509 184 Z1 | 10/1992 | European Pat. Off. . |
| 0 561 271 A2 | 9/1993 | European Pat. Off. . |
| 0 627 742 A2 | 12/1994 | European Pat. Off. . |
| 0 637 035 A1 | 2/1995 | European Pat. Off. . |

OTHER PUBLICATIONS

Patent Abstracts of Japan No. 5–28783 (Yamamoto), dated Jul. 24, 1991.

Primary Examiner—Richard Elms
Assistant Examiner—Hien Nguyen
Attorney, Agent, or Firm—Herbert L. Lerner; Laurence A. Greenberg; Werner H. Stemer

[57] ABSTRACT

A read-only memory having a multiplicity of memory cells whose contents can be read out with appropriate addressing by word, bit and source lines. The read-only memory is distinguished by the fact that the memory cells which can be addressed via an individual word line are divided into a multiplicity of groups, to each of which a separate common source line is assigned. Accordingly, a group-by-group read-out of the memory cells which can be addressed via an individual word line is carried out.

18 Claims, 3 Drawing Sheets

READ-ONLY MEMORY HAVING SPECIALLY OUTPUT CIRCUITS AND WORD LINE CONNECTED TO A GROUP OF MEMORY CELLS

CROSS-REFERENCE TO RELATED APPLICATION

This is a continuation of International Application PCT/DE96/02241, filed on Nov. 21, 1996, which designated the United States.

BACKGROUND OF THE INVENTION

1. Field of the Invention

The present invention relates to a read-only memory which has a multiplicity of memory cells whose contents can be read out with appropriate addressing by word, bit and source lines. The memory cells which can be addressed via an individual word line are divided into a multiplicity of groups, to each of which a separate common source line is assigned. The bit lines of different groups of memory cells are connected via connecting devices with common data output lines for outputting the data stored in the memory cells from the read-only memory.

Read-only memories (ROM, PROM, EPROM, EEPROM and the like) and methods for addressing the same are well known in the art. A practical example of the structure and addressing of a conventional read-only memory are explained below.

A typical ROM has a multiplicity of memory cells whose contents can be read out with corresponding addressing by word, bit and source lines. In the case of a ROM, in contrast to some other types of read-only memories (for example EPROM and EEPROM), the memory cells have a structure which depends on the information ("0" or "1") to be provided during the read-out. In one embodiment of the ROM, a transistor is used, and, in a second embodiment, the transistor is omitted without a replacement and the signal lines (word, bit and source line) which are otherwise connected to the transistor run free.

However, in these prior art devices, the current consumption during reading is relatively high and reading takes a relatively long time.

SUMMARY OF THE INVENTION

It is accordingly an object of the invention to provide a read-only memory and method for addressing the same which overcome the hereinafore-mentioned disadvantages of the heretofore-known products and methods of this general type, and where the reading out of data from the ROM can be carried out faster and with a reduced power consumption.

With the foregoing and other objects in view there is provided, in accordance with the invention, a read-only memory, including word lines, bit lines and source lines, each of the bit lines having a bit line potential; a multiplicity of memory cells connected to the word lines, the bit lines and the source lines, the memory cells having data contents and the data contents are read out with appropriate addressing of the word lines, the bit lines and the source lines, the memory cells are addressed by an individual word line; the memory cells are divided into a multiplicity of memory cell groups, each of the memory cell groups has a separate common source line, the memory cell groups forming a memory cell array; common data output lines; and connecting devices connected between the bit lines of the memory cells of the memory cell groups and the common data output lines for outputting the data contents stored in the memory cells, the connecting devices operating under sole dependency on the bit line potential.

Accordingly, it is provided that the memory cells which can be addressed via an individual word line are divided into a multiplicity of groups. Each of the groups have a separate common source line, and group-by-group reading out of the memory cells which can be addressed via an individual word line are carried out.

These measures make it possible to address, for the purpose of reading out, only those memory cells whose contents are actually intended to be outputted from the read-only memory. More precisely, during the reading out of the data from the memory cells, any possibly occurring discharge processes of the precharged bit lines can be selectively restricted to quite specific regions within a row of the memory cell array. This limited or partial reading capability has not been previously possible to date on account of the provision of only a single common source line for all the memory cells of the memory cell array (the discharge of the precharged bit lines could only take place in units of rows of the memory cell array).

Specifically, if the source line of a memory cell group which is to be read out, is put at a potential suitable for reading (for example 0 V) and the source line of a memory cell group which is not set to be read out, is put at a potential which is not suitable for reading (for example at a high voltage of, for example, +5 V), then the precharged bit line(s) can be discharged exclusively within the memory cell groups to be outputted, where:

1) no switching-on of one or more transistor or transistors which may be present per memory cell, and
2) no discharge of the precharged bit lines take place within the other groups not selected to be read out.

This quite obviously leads to a considerable power savings. By virtue of the fact that a read operation is carried out at only a relatively few memory cells, owing to the group-by-group read-out, the fewer data outputs can be passed directly, omitting the customarily provided multiplexer, to data output or bus lines which are provided in an appropriate number. From the bus lines, the data can be outputted from the read-only memory without additional, complicated selection methods and devices. Dispensing with the multiplexer leads to further power savings and to considerably earlier output of the data to be read from the read-only memory.

The read-out of data from the read-only memory can consequently be carried out considerably faster and with reduced power consumption. The read-only memory can furthermore, due to the possible omission of the extremely costly multiplexer, be produced more simply and smaller.

In accordance with an added feature of the invention, at least some of the memory cells each have at least one transistor.

In accordance with another feature of the invention, the memory cells are each connected to a word line, a bit line and a source line.

In accordance with an additional feature of the invention, the memory cells are disposed in rows and the memory cells disposed in the same row of the memory cell array are each connected to the same word line.

In accordance with yet another added feature of the invention, the memory cells are disposed in columns and the memory cells disposed in the same column of the memory cell array are each connected to the same bit line.

In accordance with yet another feature of the invention, the memory cells are disposed in columns and the memory cells disposed in the same column of the memory cell array are each connected to the same source line.

In accordance with yet another additional feature of the invention, each of the memory cells are configured for storing a data bit.

In accordance with yet another further added feature of the invention, each of the memory cell groups are configured for storing a data word formed of data bits.

In accordance with yet another further feature of the invention, the data word is a data byte.

In accordance with yet another further additional feature of the invention, the memory cells of a memory cell group are distributed over a row of the memory cell array.

In accordance with an added feature of the invention, the memory cell groups formed in the row of the memory cell array are the same size.

In accordance with another feature of the invention, the memory cell groups formed in the row of the memory cell array are of different sizes.

In accordance with an additional feature of the invention, each of the data output lines is connected to separate connecting devices, each of the separate connecting devices are connected to one bit line per memory cell groups.

In accordance with another added feature of the invention, each of the memory cells is connected to precisely one of the data output lines.

In accordance with another additional feature of the invention, the data output lines are provided in a number which corresponds to a number of the memory cells in the largest memory cell group.

In accordance with yet another added feature of the invention, the connecting devices are configured to allow only selected memory cells of the memory cells to output the data contents of the memory cells onto the data output lines.

In accordance with yet another additional feature of the invnetion, the connecting devices are each configured to actively switch a signal to a corresponding data output line when a respectively assigned bit line changes its potential in a predetermined direction.

With the foregoing and other objects in view there is also provided, in accordance with the invention, a method for addressing a read-only memory having a multiplicity of memory cells storing data, word lines, bit lines, source lines, and common data output lines, the memory cells being divided into a multiplicity of memory cell groups, each of the memory cell groups having a separate common source line and the memory cell groups forming a memory cell array being addressed by the word lines, the bit lines and the source lines, which includes carrying out a group-by-group read-out of the memory cells being addressed via an individual word line.

In accordance with an added feature of the invention, there is the step of reading out only the memory cells whose data are subsequently also output from the read-only memory.

In accordance with another feature of the invention, there is the step of reading out the data from only one of the memory cell groups.

In accordance with an additional feature of the invention, there is the step of applying a voltage suitable for changing a potential of an assigned bit line to the source line of the memory cell group to be read out.

In accordance with a concomitant feature of the invention, there is the step of applying a voltage which is unable to change a potential of assigned bit lines to the source lines of the memory cell groups which are not to be read out.

Other features which are considered as characteristic for the invention are set forth in the appended claims.

Although the invention is illustrated and described herein as embodied in a read-only memory and method for addressing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
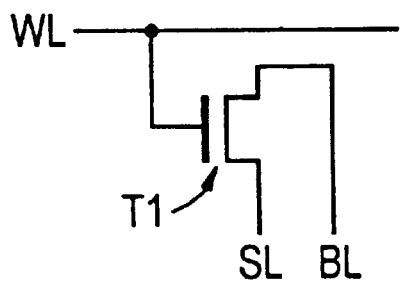
FIG. 3 is schematic diagram of the structure of a known ROM memory cell.

Referring now to the figures of the drawing in detail and first, particularly, to FIG. 3 thereof, there is shown a known ROM memory cell including a transistor T1.

In this case, the transistor T1 is in the form of a field-effect transistor T1, whose source is connected to a source line SL, whose drain is connected to a bit line BL and whose gate is connected to a word line WL.

The reading-out of "stored" data from the ROM occurs as stated below. First, the bit line BL is charged by a precharge signal to a specific potential, for example to approximately +4 V. The bit line BL and its external circuitry are configured in such a way that, provided that the transistor T1 is in the off state or no transistor is present, it maintains the potential even after an interruption of the connection to the precharge signal source.

If the transistor T1 is addressed or selected for reading in this state, that is to say if a voltage of, for example, +5 V is applied via the word line WL to the gate of the transistor T1 and the source line SL is connected to earth, than the memory transistor T1 is switched on and the increased charge carriers on the bit line BL flow away to earth via the transistor T1. The potential of the bit line BL consequently drops to 0 V.

On the other hand, in the case of a memory cell MC which does not have a transistor, the lack of the transistor means that the potential applied to the bit line by the precharge cannot dissipate, but rather is essentially maintained.

The potentials of the bit line BL, which potentials depend on the memory contents of the respective memory cell, consequently enable the memory contents to be determined. Although other types of read-only memories may have a completely different structure of the memory cells, they share features with the ROM memory cells insofar as they are connected to the same signal lines (word line, bit line, source line) and essentially the same signals are applied to the signal lines for the purpose of reading, and a change in the signals has comparable effects.

The word line WL can, as in the case of the EEPROM, include a plurality of signal lines (selection line, control line), but this does not produce any fundamental change in the general addressing principle described.

Like the memory cells of other types of read-only memories, the memory cell shown in FIG. 3 can be combined to form a memory cell array.

Figure 4:
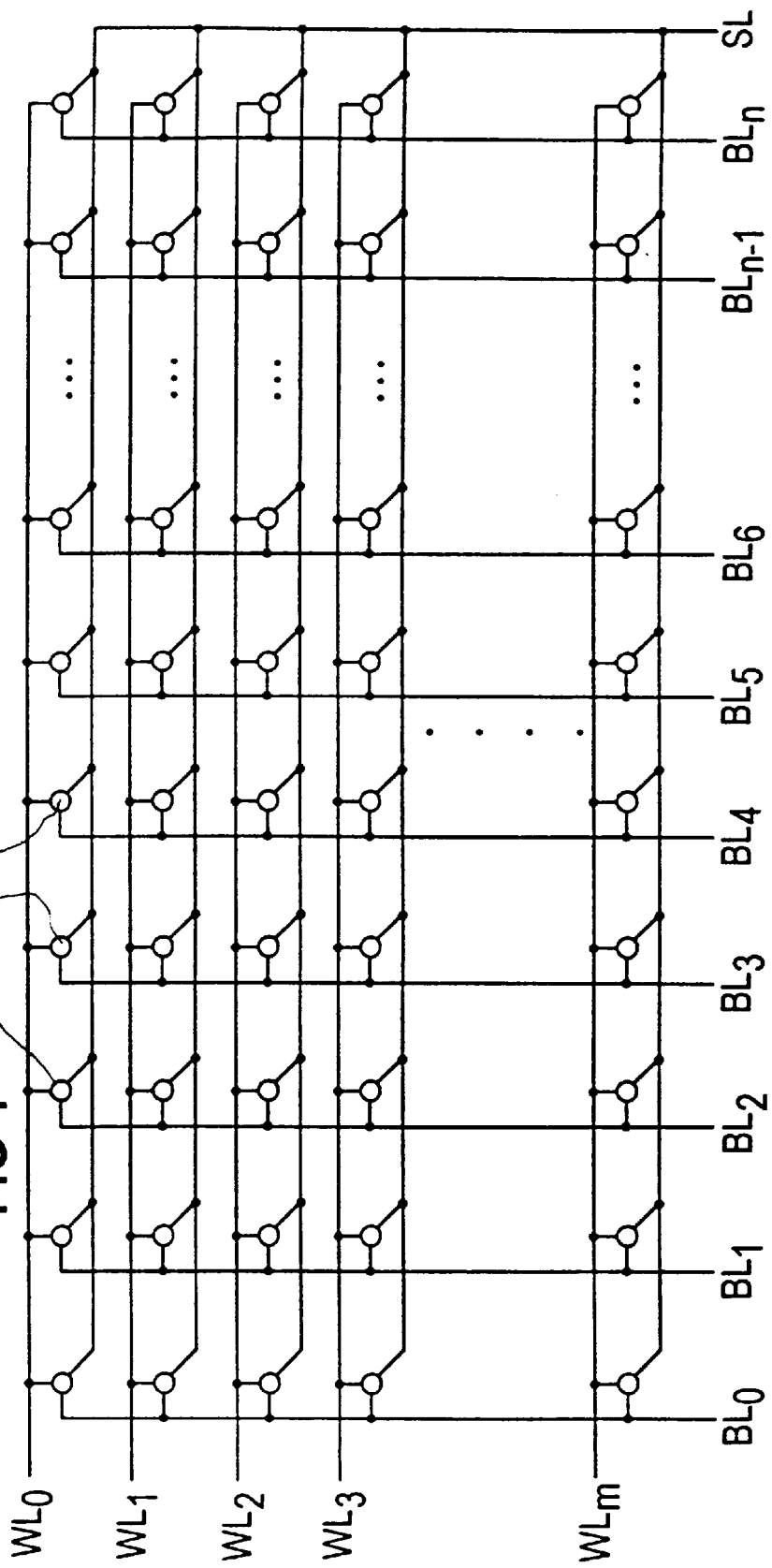
FIG. 4 is a circuit diagram of the structure of a conventional ROM memory cell array according to the prior art.

The structure of such a memory cell array is illustrated in FIG. 4. FIG. 4 is a diagrammatic illustration of a memory cell array of a conventional read-only memory.

The memory cell array shown has a multiplicity of individual memory cells MC according to FIG. 3 which are identified by an "o" and are disposed in a plurality (m) of rows and a plurality (n) of columns.

The n elements of each row of the memory cell array are in each case connected to a common word line $WL_0$, $WL_1 \ldots WL_m$ (if appropriate including a selection line and a control line). The m elements of each column of the memory cell array are in each case connected to a common bit line $BL_0$, $BL_1 \ldots BL_n$. The source lines SL for all the memory cells MC of the memory cell array are combined to form a common source line.

The interconnection of the memory cells to form the memory cell array shown in FIG. 4 has a matrix-like structure. The matrix-like structure enables the contents of the memory cells MC to be outputted individually from the read-only memory with relatively little control outlay by use of appropriate addressing of the word, bit and source lines.

Figure 1:
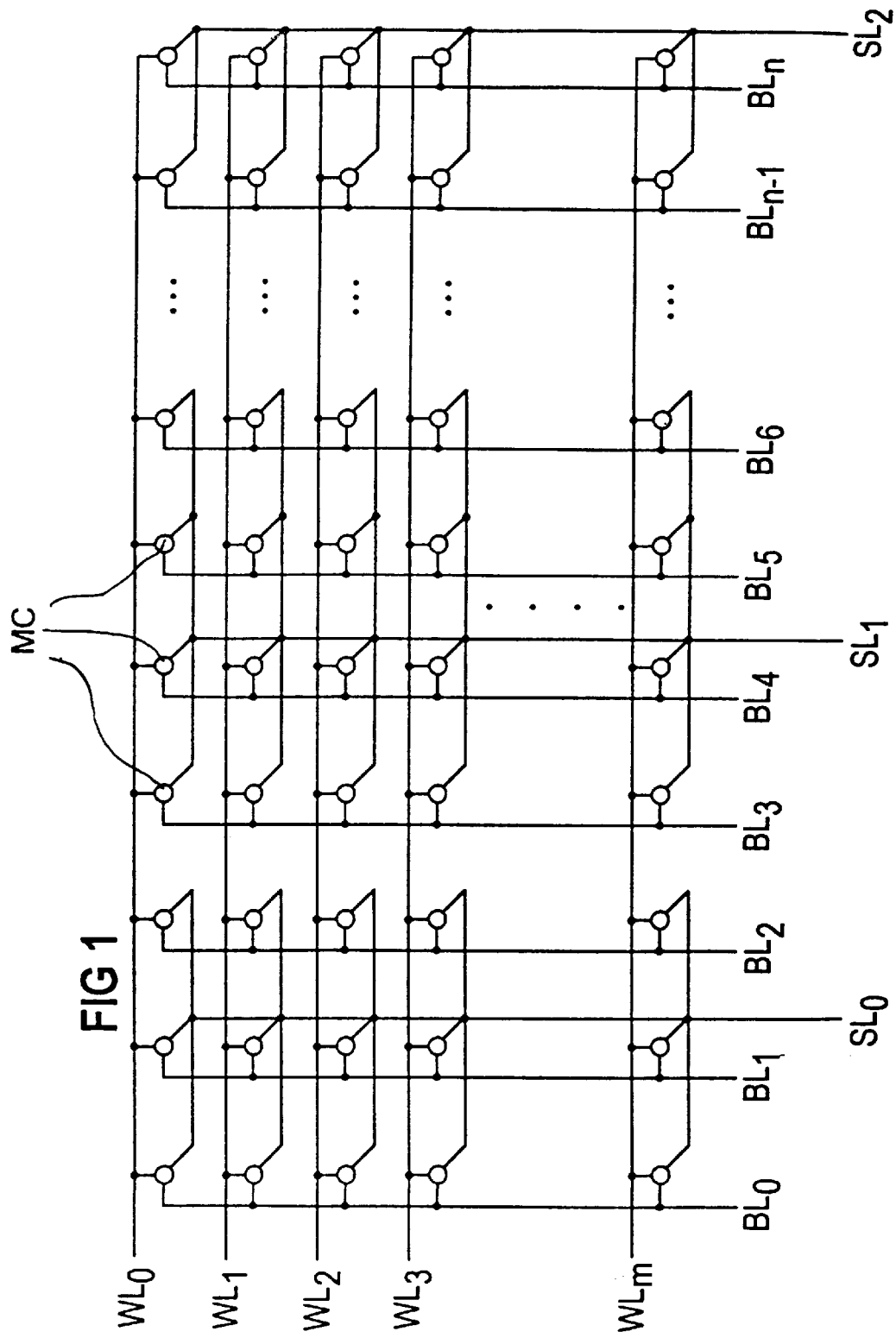
FIG. 1 is a circuit diagram of an exemplary embodiment of a structure of a memory cell array of a ROM according to the invention.

According to the invention of the instant application, there is shown in FIG. 1 a multiplicity of memory cells MC (for example memory cells of the type shown in FIG. 3) which are each identified by the symbol "o" and are arranged in a multiplicity (m) of rows and a multiplicity (n) of columns.

The n elements of each row of the memory cell array are in each case connected to a common word line $WL_0$, $WL_1, \ldots WL_m$ (if appropriate also including a selection line and a control line). The m elements of each column of the memory cell array are in each case connected to a common bit line $BL_0$, $BL_1 \ldots BL_n$.

In contrast to the conventional memory cell array shown in FIG. 4, however, the source lines SL of the memory cells MC are no longer combined to form a source line SL common to all of the memory cells MC of the memory cell array. Rather any desired multiplicity of separate source lines SL are provided ($SL_0$, $SL_1$ and $SL_2$ are shown by way of example in FIG. 1), each of which is assigned to a specific group of memory cells MC within a row of the memory cell array. In other words, the memory cells MC of a row of the memory cell array are divided into a plurality of groups, each of which has a separate source line, which is, however, common to the memory cells of a respective group.

As a rule, a memory cell group will in practice contain as many memory cells as a data word (for example a byte) has bits, and a multiplicity of identical memory cell groups of this type lying next to one another (strung one after the other) will be provided per row of the memory cell array.

In general terms, however, each row of the memory cell array can, depending on the requirement, have any desired multiplicity of groups (at least two), which may be the same size or have different sizes, may include any desired number of memory cells MC (at least one) and whose individual elements or memory cells MC may be distributed as desired over the row of the memory cell array.

One of the resultant possibilities, which departs from the aforementioned rule, then consists, for example, in combining the memory cells MC of every xth data word within a row of the memory cell array to form a group (in order, for example to be able to read out only characters of a text to be displayed, but not the display attributes respectively assigned to them).

The illustration of FIG. 1 shows three memory cell groups. The first group (the left-hand group according to FIG. 1) includes the memory cells MC which are situated next to one another and whose source lines are combined to form a separate common source line $SL_0$. The adjoining second group (the middle group according to FIG. 1) includes the memory cells MC which are situated next to one another and whose source lines are combined to form a separate common source line $SL_1$. The third group (the right-hand group according to FIG. 1) includes the memory cells MC which are situated next to one another and whose source lines are combined to form a separate common source line $SL_2$.

In FIG. 1, the group division is the same for all the rows of the memory cell array. The respective common source lines of the mutually corresponding groups in different rows of the memory cell array are connected to one another. Although a structure of this type limits the necessary complexity for realizing the memory cell array, it is, of course, not mandatory. Rather each row of the memory cell array can be subdivided as desired completely independently of the other rows and the source lines of the respective groups can be laid and driven completely independently of one another.

The described configuration of the memory cell array permits (using an appropriate control device) group-by-group addressing (selection) of the memory cells MC which can be addressed via an individual word line WL. It is possible for a group, as already indicated above, also to include just a single memory cell in the extreme case.

This has an extremely advantageous effect particularly when reading out data. In the case of conventional memory cell arrays, as already mentioned in the introduction, the reading-out of data from memory cells MC (in contrast to the output of data from the read-only memory) was possible only in units of rows of the whole memory cell array.

Selective reading out from an individual group within a row of the memory cell array takes place largely as in the case of conventional read-only memories (see FIG. 3 and the description referring thereto).

In contradistinction to conventional read-only memories, however, the voltage required for reading (in the present exemplary embodiment 0 V) is applied via the corresponding source line(s) only to those source connections which are to be read. Those memory elements of the relevant row of the memory cell array which are not to be read or are not required for the output, have a source voltage applied to them (in the present example a high voltage of, for example, +5 V) which is not suitable for reading. In other words, the voltage prevents the discharging of the precharged bit line BL via one or more transistors.

Since, on the one hand, only the transistors of the memory cells MC actually of interest are switched into the on state and consequently, on the other hand, also only those bit lines are discharged whose state is of interest for the output, the power consumption during the read-out of the data is reduced to a fraction of that which is necessary when data is read out from a conventional read-only memory.

The fact that the bit lines BL of the memory cells MC which are not of interest are not discharged during reading of the data of interest can also be used to good effect for the capability of passing the read data of the memory cells MC selected by the source lines SL (in contrast to the data of the respectively unselected memory cells) to the bus lines via which the data can be directly outputted to. That is to say without the interposition of the customarily provided multiplexer or the like from the read-only memory.

Figure 2:
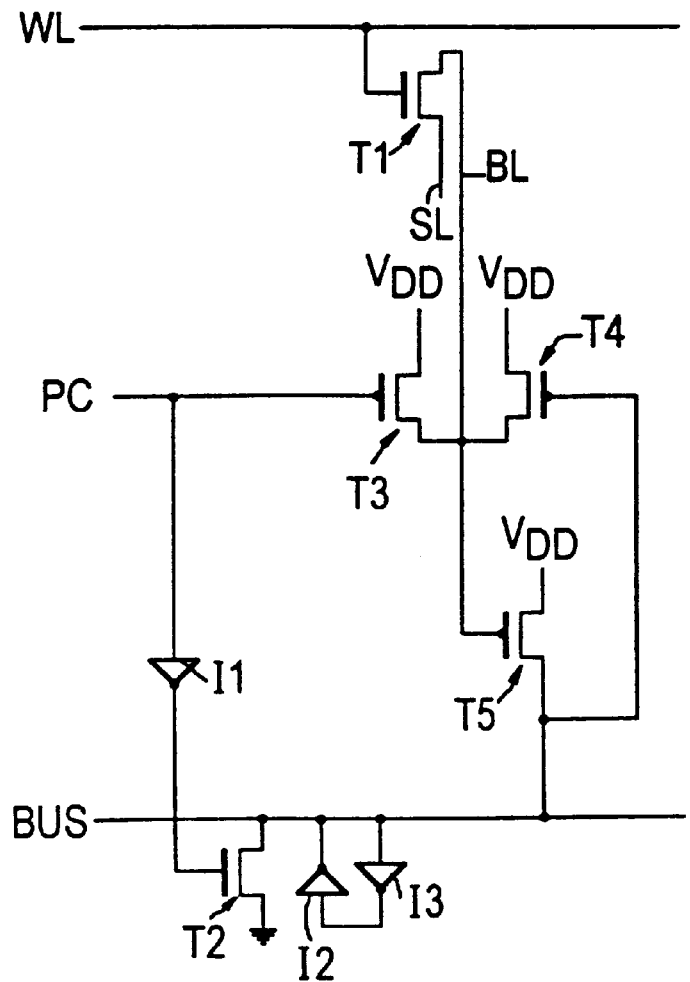
FIG. 2 is a schematic diagram of a configuration for directly connecting data, read from selected memory cells of the ROM, to data output lines of an output bus.

This extremely advantageous effect is explained below with reference to FIG. 2. FIG. 2 illustrates how a signal can be brought onto an output bus line as a function of the state of the bit line of a selected memory cell.

In the explanation which follows, the following premises are taken as a basis for reasons of clarity. It will be assumed that the n elements of each of the m rows of the memory cell array shown in FIG. 1 are divided into i groups of the same size, where each group may have a number of memory cells MC which correspond to the number of bits of the stored data words. In the present exemplary embodiment, the data words will be bytes, with the result that each of the i groups comprises j=8 memory cells.

Of the 8 memory cells MC of the m * i groups, a respective first memory cell MC is assigned to a first bus line, a respective second memory cell MC is assigned to a second bus line, a respective third memory cell MC is assigned to a third bus line, a respective fourth memory cell MC is assigned to a fourth bus line, a respective fifth memory cell MC is assigned to a fifth bus line, a respective sixth memory cell MC is assigned to a sixth bus line, a respective seventh memory cell MC is assigned to a seventh bus line and a respective eighth memory cell MC is assigned to an eighth bus line.

The connection of an xth memory cell MC of any desired group to the xth bus line is illustrated for a ROM in FIG. 2. The use of other read-only memories requires slight modifications, under certain circumstances, in accordance with the different conditions.

According to FIG. 2, the arrangement has NMOS field-effect transistors T1 and T2, PMOS field-effect transistors T3, T4 and T5 and inverters I1, I2 and I3, which are connected in the manner shown to the word line WL, the bit line BL, the source line SL of a bus line BUS, a precharge line PC and a voltage $V_{DD}$ of, for example, approximately 5 V. The transistor T1 is equivalent to the ROM memory cell transistor shown in FIG. 3.

At the beginning of each read cycle, a low voltage of, for example, 0 V is momentarily applied to the precharge line. The effect of this is that, on the one hand, the bus lines BUS are pulled to earth potential via the transistor T2 which then switches on (for this purpose the first inverter I1 can be connected in the manner shown via respective transistors T2 to all the bus lines present) and that, on the other hand, the bit line BL is raised to the potential $V_{DD}$ via the transistor T3 which then switches on.

The inverters I2 and I3 connected to the bus line BUS form a holding element which holds the potential of the bus line at earth potential when the transistor T2 falls back into the off state (a holding element of this type is provided for each of the bus lines). The inverter I2 is in each case weak in relation to the transistor T5.

The bit line BL likewise maintains its potential when the transistor T3 falls back into the off state, because the bus potential (earth) present at the gate connection of the transistor T4 switches the voltage $V_{DD}$ to the bit line via the transistor T4. The operation described is the same for all the memory cells MC of a memory array.

Firstly, the connection of a stored item of data from a selected memory cell (the word line WL is at a voltage, suitable for reading, of, for example, +5 V, the source line SL is at a voltage, likewise suitable for reading, of, for example, 0 V or at earth) to the bus line BUS will now be described.

Upon application of the signals to the transistor T1 (selection) via the word line WL and the source line SL, the transistor T1 is switched on and actively pulls the bit line to the source line potential (earth) since the transistor T1 is strong in relation to the transistor T4.

Due to the change in the potential of the bit line BL, the transistor T5 is switched on and switches $V_{DD}$ to the bus. As a result of the transistor T5 switching on, the transistor T4 goes into the off state, with the result that the bit line BL is then reliably connected to earth via the transistor T1.

If a memory cell MC having the transistor T1 is selected, the bus line BUS is put at a high potential which is actively driven by the transistor.

If a ROM memory cell which does not have a transistor is selected, the same situation exists as existed after the application of the precharge voltage via the precharge line PC, because without the transistor T1 the bit line BL which is actively kept at a high potential by the transistor T4 cannot be discharged. That is to say, if a ROM memory cell which does not have a transistor T1 is selected, the bus line BUS remains at earth potential.

The bus line BUS has connected to it, as already mentioned above, a multiplicity of further memory cells MC from other groups (one memory cell per other group) which, however, except for the first memory cell MC just described, may all be in the unselected state.

In order to ensure that the circuit shown in FIG. 2 functions as intended, the unselected memory cells must not exert any influence on the bus line BUS, since otherwise they might change the data brought by the selected memory cells.

That this is in actual fact always automatically the case with the configuration shown in FIG. 2, despite its simple structure, will now be explained. A memory cell MC is unselected if the source line has a high level and/or if the word line has a low level. One of these conditions (sometimes both conditions, too) is met in all of the memory cells MC, which either lie in the row of the memory cell array which is selected by the word line, yet not in the group selected by the source line, or lie in an unselected row of the memory cell array.

If the word line WL and the source line SL potentials which exist in the case of non-selection are applied to the memory cell MC having the transistor T1, the transistor T1 either remains in the off state (at a low word line potential) or the bit line is connected via the transistor to the high source line potential.

In both cases, the bit line BL cannot be discharged, but rather remains at the initial (precharged) high potential which switches off the transistor T5 and thus precludes active influencing of the bus line.

In the unselected state, therefore, a memory cell MC having the transistor T1 behaves in a neutral manner with respect to the bus line assigned to it.

The same also applies to the memory cell MC which does not have the transistor T1, since the lack of the transistor T1 means that the bit line BL cannot actively be discharged independently of the selection state of the memory cell MC, with the result that in this case, too, the transistor T5 remains in the off state and thus active influencing of the bus line is precluded.

In the unselected state, therefore, the memory cell MC which does not have the transistor T1 likewise behaves in a neutral manner with respect to the bus line assigned to it.

In other words, as many memory cells MC are connected to each bus line as there are groups within the memory cell array. Only the selected group can bring the signals corresponding to the stored data onto the bus line.

Consequently, it is possible to dispense with the customarily provided multiplexer, which had to be used, during each read cycle, to select from the read data corresponding to a complete row of the memory cell array those data actually intended to be outputted.

Although, in the case of the described configuration and the described addressing method, it is necessary to provide a decoder which, using the address to be read out from the memory, determines the group to be selected. That is to say, it determines the group whose source line SL, in contrast to all the other source lines SL, is to have applied to it a potential suitable for reading. Such decoders are extremely simple and small in their structure so that the outlay to be accepted as a result is completely negligible.

The above description, in particular that of FIG. 2, refers primarily to the fact that all of the memory cell groups of a memory cell array are the same size. However, this is not a necessary condition. Rather the memory cell groups can differ from one another and be as large as desired. The number of memory cells MC of the largest memory cell group should then correspond, however, to the number of bus lines provided as described.

It is also possible notably and advantageously to employ the effect that when the bus line is simultaneously connected to a plurality of selected memory cells (from the same or different memory cell groups), it can simultaneously assume the function of an OR or EXCLUSIVE-OR element.

The structure of the read-only memory according to the invention and the inventive method for addressing the same were explained above with reference to a ROM. However, the same effects and advantages of the measures described can also be achieved when providing the same in other types of read-only memories (PROM, EPROM, EEPROM, etc.).

I claim:

1. A read-only memory, comprising:
   word lines, bit lines and source lines, each of said bit lines having a bit line potential;
   a multiplicity of memory cells connected to said word lines, said bit lines and said source lines, said memory cells having data contents and the data contents being read out with appropriate addressing of said word lines, said bit lines and said source lines, said memory cells addressed by an individual word line;
   said memory cells divided into a multiplicity of memory cell groups, each of said memory cell groups having a separate common source line, said memory cell groups forming a memory cell array;
   common data output lines, each memory cell group connected to a respective one of said common data output lines; and
   connecting devices connected between said bit lines of said memory cells of said memory cell groups and said common data output lines for outputting the data contents stored in said memory cells, each of said connecting devices for putting a potential that is on one of said bit lines onto one of said common data output lines at the beginning of a read cycle while said one bit line is discharging and for subsequently actively driving said one bit line.

2. The read-only memory according to claim 1, wherein at least some of said memory cells each have at least one transistor.

3. The read-only memory according to claim 1, wherein said memory cells are each connected to a word line, a bit line and a source line.

4. The read-only memory according to claim 1, wherein said memory cells are disposed in rows and said memory cells disposed in the same row of said memory cell array are each connected to the same word line.

5. The read-only memory according to claim 1, wherein said memory cells are disposed in columns and said memory cells disposed in the same column of said memory cell array are each connected to the same bit line.

6. The read-only memory according to claim 1, wherein said memory cells are disposed in columns and said memory cells disposed in the same column of said memory cell array are each connected to the same source line.

7. The read-only memory according to claim 1, wherein each of said memory cells are configured for storing a data bit.

8. The read-only memory according to claim 1, wherein each of said memory cell groups are configured for storing a data word formed of data bits.

9. The read-only memory according to claim 8, wherein said data word is a data byte.

10. The read-only memory according to claim 1, wherein said memory cells of a memory cell group are distributed over a row of said memory cell array.

11. The read-only memory according to claim 10, wherein said memory cell groups formed in said row of said memory cell array are the same size.

12. The read-only memory according to claim 10, wherein said memory cell groups formed in said row of said memory cell array are of different sizes.

13. The read-only memory according to claim 1, wherein each of said data output lines is connected to separate connecting devices, each of said separate connecting devices are connected to one bit line per said memory cell groups.

14. The read-only memory according to claim 13, wherein each of said memory cells is connected to precisely one of said data output lines.

15. The read-only memory according to claim 13, wherein said data output lines are provided in a number which corresponds to a number of said memory cells in a largest memory cell group.

16. The read-only memory according to claim 13, wherein said connecting devices are configured to allow only selected memory cells of said memory cells to output the data contents of said memory cells onto said data output lines.

17. The read-only memory according to claim 16, wherein said connecting devices are each configured to actively switch a signal to a corresponding data output line when a respectively assigned bit line changes its potential in a predetermined direction.

18. A connection configuration, comprising:
   a bus line and a bit line;
   switches connected to a precharge line, said switches for switching said bus line to a first potential and said bit line to a second potential;
   holding elements for holding potentials on said bit line and on said bus line, when said bit line and said bus line have been precharged; and
   a further switch connected to said bit line for switching said bit line to a source line at said first potential and for switching said bus line to said second potential, when said bit line has been connected to the source line at said first potential.

* * * * *